(12) United States Patent
Srivastava et al.

(10) Patent No.: US 8,114,769 B1
(45) Date of Patent: Feb. 14, 2012

(54) METHODS AND STRUCTURES TO ENABLE SELF-ALIGNED VIA ETCH FOR CU DAMASCENE STRUCTURE USING TRENCH FIRST METAL HARD MASK (TFMHM) SCHEME

(75) Inventors: Ravi Prakash Srivastava, Fishkill, NY (US); Elbert Huang, Carmel, NY (US)

(73) Assignee: Globalfoundries Singapore Pte, Lte., Singapore (SG)

( * ) Notice: Subject to any disclaimer, the term of this patent is extended or adjusted under 35 U.S.C. 154(b) by 0 days.

(21) Appl. No.: 12/982,956

(22) Filed: Dec. 31, 2010

(51) Int. Cl.
*H01L 21/4763* (2006.01)

(52) U.S. Cl. ............... 438/637; 257/E21.579; 438/597; 438/622; 438/672; 438/703; 438/761

(58) Field of Classification Search ........... 256/E21.579; 438/597, 622, 637, 672, 703, 761
See application file for complete search history.

(56) References Cited

U.S. PATENT DOCUMENTS

| | | | |
|---|---|---|---|
| 6,696,222 B2 * | 2/2004 | Hsue et al. | 430/313 |
| 6,743,711 B2 * | 6/2004 | Kim | 438/637 |
| 7,052,621 B2 * | 5/2006 | Kumar et al. | 216/51 |
| 2002/0098676 A1 * | 7/2002 | Ning et al. | 438/622 |
| 2003/0092279 A1 * | 5/2003 | Tsai et al. | 438/718 |
| 2007/0134917 A1 * | 6/2007 | Li et al. | 438/637 |
| 2007/0205507 A1 * | 9/2007 | Chang et al. | 257/734 |
| 2011/0062562 A1 * | 3/2011 | Lin | 257/649 |
| 2011/0070738 A1 * | 3/2011 | Liang et al. | 438/702 |

* cited by examiner

*Primary Examiner* — Asok Sarkar
(74) *Attorney, Agent, or Firm* — Robert D. McCutcheon

(57) ABSTRACT

A method for semiconductor fabrication using a trench first metal hard mask (TFMHM) process for damascene structures includes forming a secondary metal hard mask layer above a first metal hard mask layer after trench opening for the via (and trench) etching. The secondary metal hard mask layer is formed of metal material substantially resistant to the etching process which enables via etching to self-align (using an edge of the secondary metal mask layer). In one embodiment, the secondary metal mask layer is formed using an electroless deposition process, and may include nickel (Ni), cobalt (Co), gold, (Au), palladium (Pd), cadmium (Cd) silver (Ag), ruthenium (Ru), and alloys and/or combinations thereof. Because the first metal hard mask is usually formed of TiN, the trench and via etching process removes a significant amount of the TiN layer. Utilization of the secondary metal hard mask to protect the first metal hard mask layer further enables a reduction in the thickness of the first metal hard mask layer.

20 Claims, 4 Drawing Sheets

METHODS AND STRUCTURES TO ENABLE SELF-ALIGNED VIA ETCH FOR CU DAMASCENE STRUCTURE USING TRENCH FIRST METAL HARD MASK (TFMHM) SCHEME

TECHNICAL FIELD

The present disclosure relates generally to the manufacture of semiconductor devices, and more particularly, to a method and structure that enables self-aligned via etching using a trench first metal hard mask scheme for copper (or other) damascene structures.

BACKGROUND

Damascene techniques generally involve depositing an interlevel dielectric (ILD) layer, forming an opening in the ILD, overfilling the opening with a metal such as copper (Cu), and removing excess metal using chemical mechanical polishing (CMP). Multiple ILD layers are typically used which results in an overall interconnect structure having many wiring levels. The openings typically resemble a trench running essentially parallel to the surface of the substrate, and a filled trench is referred to as a "wire" or a "line". These are used to route signals from one location on an integrated circuit (IC) to another location. The openings forming the trench (for the wire) may extend only partially into the thickness of the ILD from the top surface. In dual damascene techniques, an opening in the ILD includes both a lower via (to contact the line beneath) in communication with an upper trench (and further may include other trenches without associated vias). Both the via and the trench are simultaneously filled. Several types of techniques are utilized, including via-first, trench-first and buried-via (though the resulting structure is generally the same for each technique).

The trench first metal hard mask (TFMHM) method has the potential to control the trench top critical dimension (CD) in the damascene structure. However, this method does not appear to adequately control via top CD because this current method includes a non-self aligned via etch process. The current process, as described more fully below, must pattern the via fairly precisely as the vias may not be overly large and misalignment to the underlying trench pattern must be minimized. This is critical to maintain sufficient dielectric spacings between metal features that are defined by via and trench patterning and placement. In addition, after opening the trench, partially etching for the vias therein, and stripping the mask layer(s), the final trench (and via) etching process—which utilizes a remaining metal hard mask layer (e.g., TiN)—needs to be precisely controlled because the chemistry (ies) used to etch the dielectric layer also removes a significant portion of the hard metal mask layer (e.g., TiN) during the process. Thus, the hard metal mask layer must be rather thick to appropriately act as the mask for etching.

Accordingly, there is needed a damascene fabrication process (and structure) that results in a self-aligned via etch process. In addition, there is needed fabrication process that allows for a thinner metal hard mask layer within a TFMHM damascene process.

SUMMARY

According to an embodiment of the disclosure, there is provided a method for making a semiconductor component. The method includes forming an insulating layer over a first metal layer and forming a first metal hard mask (MHM) layer over the insulating layer, the first MHM layer comprising a first material. A trench mask layer is formed over the first MHM layer which is etched to form one or more openings through the first MHM layer corresponding to the trench mask layer, and the trench mask layer is removed. After removing portions of the first MHM layer, a second MHM layer is formed over remaining portions of the first MHM layer, the second MHM layer comprising a second material different from the first material. A via mask layer is formed above the second MHM layer of which at least a portion of the insulating layer corresponding to the via mask layer is etched to at least partially form a via opening within the insulating layer. The via mask layer is removed and portions of the insulating layer corresponding to the second MHM layer are etched to form the via opening for exposing at least a portion of the metal layer and to form a metal line in the insulating layer.

According to an embodiment of the disclosure, there is provided a semiconductor fabrication process including forming an insulating layer over a first metal layer and forming a first metal hard mask (MHM) layer over the insulating layer, the first MHM layer comprising a first material. Selected portions of the first MHM layer are removed to form one or more openings through the first MHM layer, and after removing the selected portions of the first MHM layer, forming a second MHM layer over remaining portions of the first MHM layer, the second MHM layer comprising a second material different from the first material. A via mask layer is formed above the second MHM layer and at least a portion of the insulating layer corresponding to the via mask layer is etched to at least partially form a via opening within the insulating layer. The via mask layer is removed and portions of the insulating layer corresponding to the second MHM layer are removed to form the via opening for exposing at least a portion of the metal layer and to form a metal line in the insulating layer.

In another embodiment, the second MHM layer is formed by an electroless deposition process that includes exposing the first MHM layer to an aqueous solution having ions of the second material and a reducing agent.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1A:
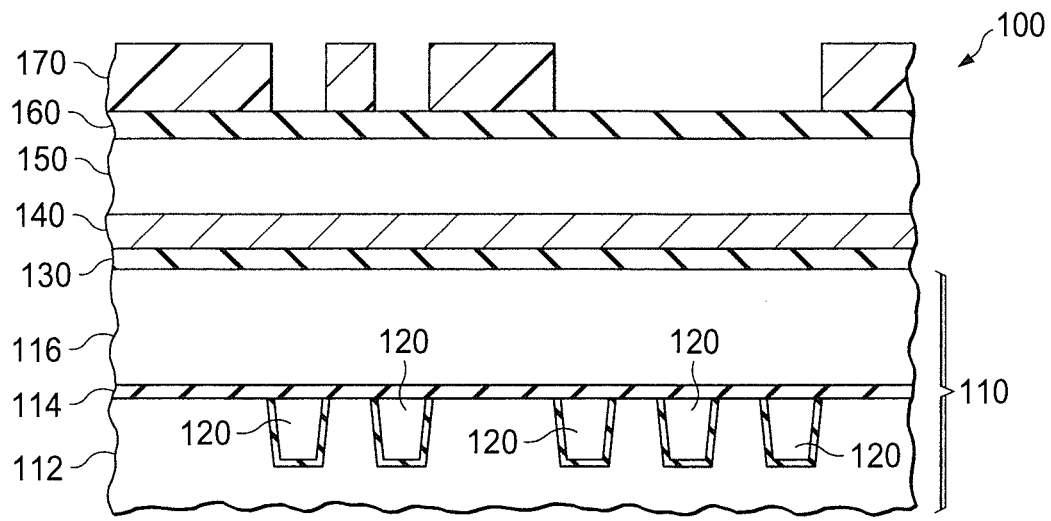
FIGS. 1A-1F illustrate relevant portions of a conventional trench first metal hard mask (TFMHM) process that may be used with particular embodiments of the disclosure.

FIGS. 1A-1F and 2A-2F and the various embodiments used to describe the principles of the present disclosure in this patent document are by way of illustration only and should not be construed in any way to limit its scope. Those skilled in the art will understand that the principles described herein may be implemented with any type of suitably arranged device and/or devices.

To simplify the drawings, reference numerals from previous drawings may sometimes not be repeated for structures that have already been identified.

FIGS. 1A through 1F illustrate example semiconductor fabrication steps (and portions of a semiconductor device undergoing fabrication) that may be used with particular embodiments. In this particular example, the fabrication is for a damascene structure undergoing what is referred to as a trench first hard mask layer (TMHML) process.

Now turning to FIGS. 1A through 1F, there is illustrated a conventional prior art trench first metal hard mask (TFMHM) process flow in a dual damascene process for a semiconductor device 100. As will be appreciated, the device 100 in FIG. 1A is shown configured at an initial mask stage for patterning vias and trenches (for eventual fabrication of a second metal line/layer and vias between a first metal line/layer and the second two metal line/layer).

The device 100 may include numerous layers. In the embodiment shown, the device 100 includes a dielectric layer 110 having one or more metal lines (or layers) 120 therein. The metal lines or layers 120 are formed of conductive material, such as copper (Cu), and may be other suitable conductive material. As will be appreciated, the dielectric layer 110 may include multiple dielectric layers, including a first dielectric layer 112, a second dielectric layer 114 and a third dielectric layer 116. In one embodiment, the first and third dielectric layers 112, 115 are formed of ultra-low K dielectric materials, while the second dielectric layer 114 may be formed of silicon-carbon-hydrogen-nitrogen, which is typically used for capping inter-level dielectric (ILD) layers, and particularly useful as a copper diffusion barrier. As will be appreciated, the second and third layers 114, 115 typically form what is commonly known as an ILD layer.

Above ILD layer 115 are formed various layers, which have various functions, including sacrificial or mask functions, or both. As shown, the device 100 includes a hard mask layer 130, a metal hard mask layer 140, a planarizing layer 150 and a silicon anti-reflective coating layer 160. In one embodiment, the hard mask layer 130 may be formed with of tetraethyl orthosilicate (TEOS), the metal hard mask layer 140 may be formed of titanium nitride (TiN), and the planarizing layer 150 may be an organic planarizing layer (OPL). Above these layers is disposed or formed a mask layer 170 which is typically formed of resist material.

As shown, the mask layer 170 includes openings for patterning trenches (e.g., trenches 180, 182, 184 as described and illustrated further below) that will eventually be formed within the ILD 116 during subsequent processing steps. After patterning, an etching process and a removal process are performed utilizing any suitable processes, including reactive ion etching (RIE) for the etching process. The etching process removes the patterned portions of the sacrificial layers 160 and 150, and also removes the metal hard mask layer 140 (and may remove a portion of the mask layer 130 at the patterned locations—as shown). Thereafter, the removal process removes all of the mask layer 170 and the sacrificial layers 160, 150. The resultant structure is illustrated in FIG. 1B.

At this point in the process, it will be appreciated that the patterned metal hard mask layer 140 will provide a future mask for the eventual trenches 180, 182, 184 (as described and illustrated further below and in FIG. 1F).

Figure 1B:
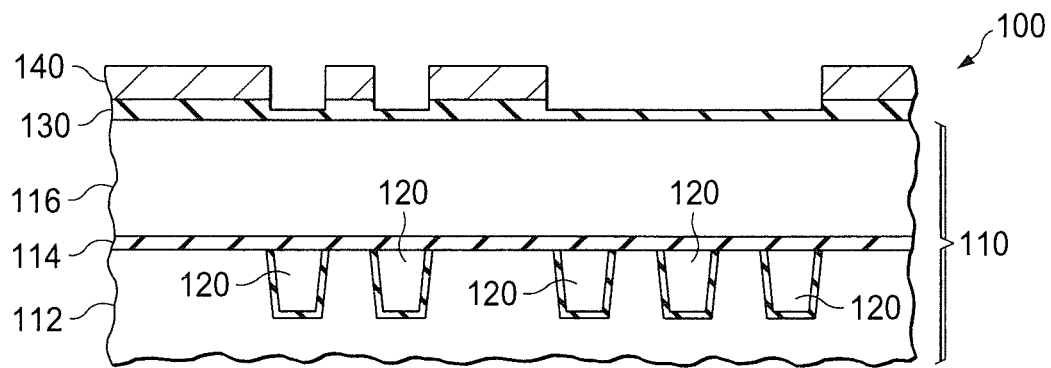
Figure 1C:
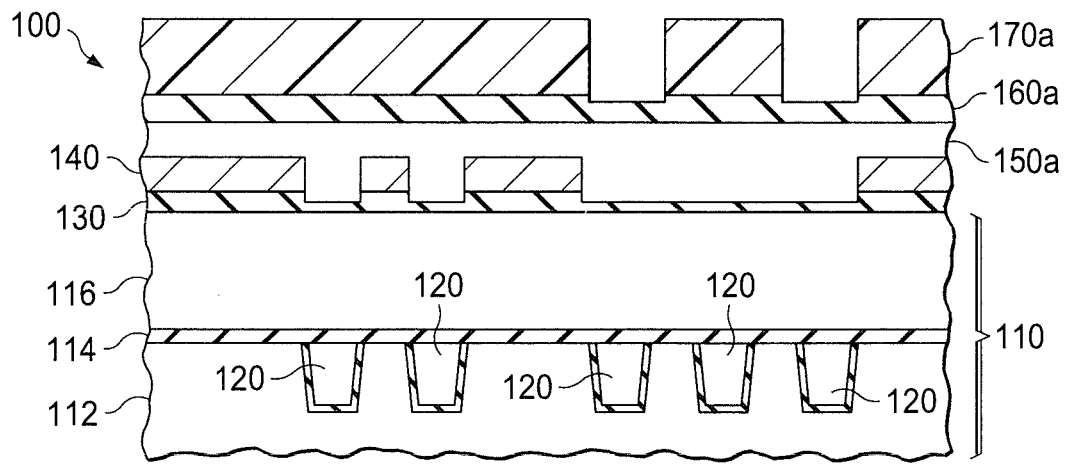

The structure shown in FIG. 1B undergoes further processing, including formation of a new planarizing layer 150a, and a new sacrificial layer 160a. Formed above these two new layers is a new mask layer 170a that includes openings for patterning vias (e.g., vias 186, 188 as described and illustrated further below and in FIG. 1F) that will eventually be formed within the ILD 116 (for contact to two of the metal lines 120) during subsequent processing steps. The resultant structure is illustrated in FIG. 1C. These layers are formed according to any suitable processes.

Figure 1D:
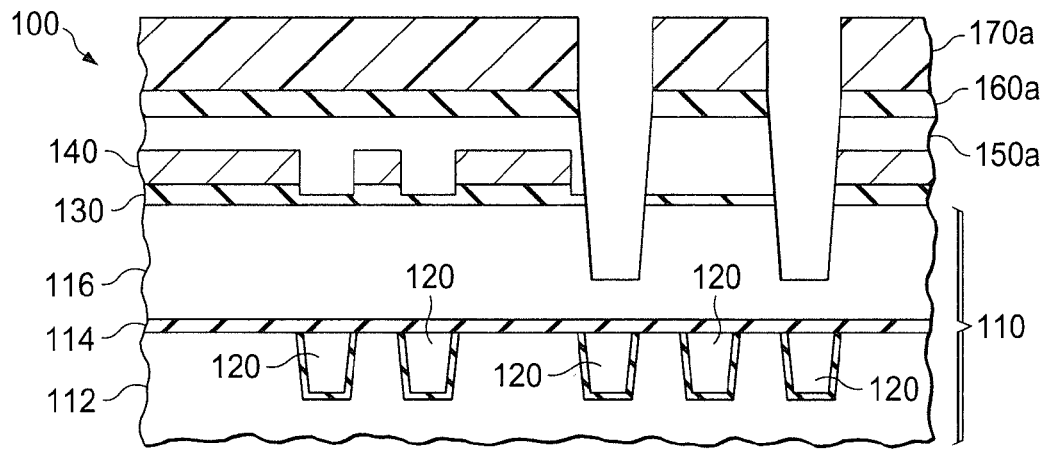
Figure 1E:
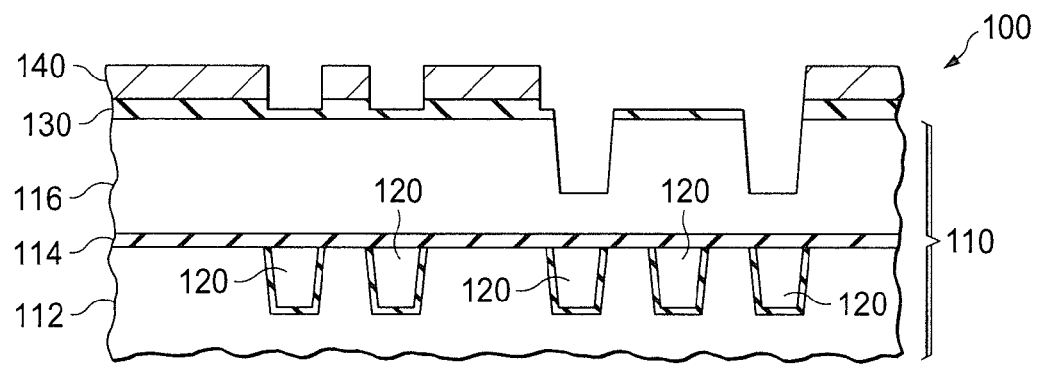
Figure 1F:
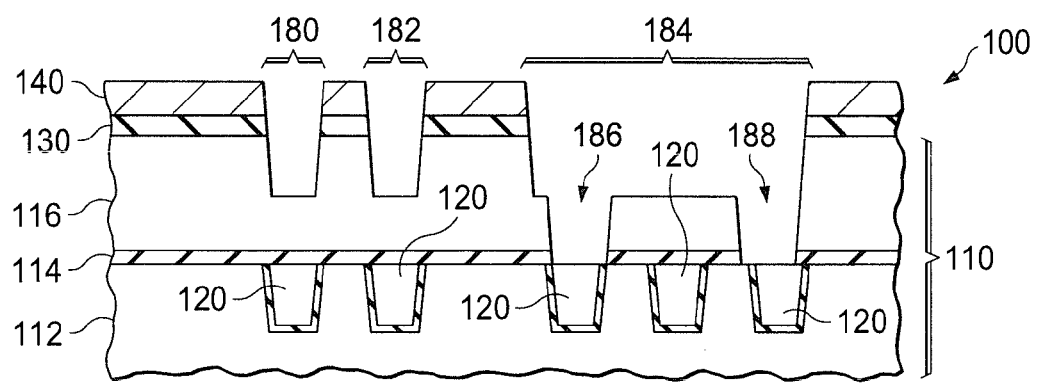

After patterning, another etching process and a removal process are performed utilizing any suitable processes, including a reactive ion etching (RIE) process. The etching process removes the patterned portions of the sacrificial layers 160a and 150a, as well as the hard mask layer 130, and removes at least a portion of the ILD layer 116 at the patterned locations, as shown. The resultant structure is illustrated in FIG. 1D. Thereafter, the removal process removes all of the mask layer 170a, and the sacrificial layers 160a, 150a. The resultant structure is illustrated in FIG. 1E.

At this point the patterned metal hard mask layer 140 provides a mask for the trenches 180, 182, 184. Another etch process is employed (using the metal hard mask layer 140 as the mask) to remove the hard mask layer 130 and additional portions of the ILD 116—at the patterned locations. Similarly, the etching process may be any suitable process, including a reactive ion etching (REI) process. The resultant structure is shown in FIG. 1F.

The above textual description and FIGS. 1A through 1F describe and illustrate the relevant portions of a conventional TFMHM damascene process. Though not shown, and as will be appreciated, the trenches 180, 182, 184 and the vias 186, 188 are over filled with conductive material, such as a metal (e.g., Cu, Al, etc.) and the resulting structure may be planarized using CMP (to remove any remaining portions of layers 130 and 140). Conventional processing steps may then be performed thereafter, such as formation of additional ILDs and metallization layers.

Now turning to FIGS. 2A through 2F, there is illustrated example semiconductor fabrication steps (and portions of a semiconductor device undergoing fabrication) in accordance with the present disclosure. In this particular example, the fabrication is for a dual-damascene structure undergoing a trench first metal hard mask (TFMHM) process. Although a TFMHM process is shown in this example, it should be understood that other dual damascene processes may benefit from the teachings of this disclosure, including via first and buried etch stop schemes along with trench first schemes that do not invoke a metal layer as a hardmask layer, and further, may be beneficially utilized for single damascene processes.

Figure 2A:
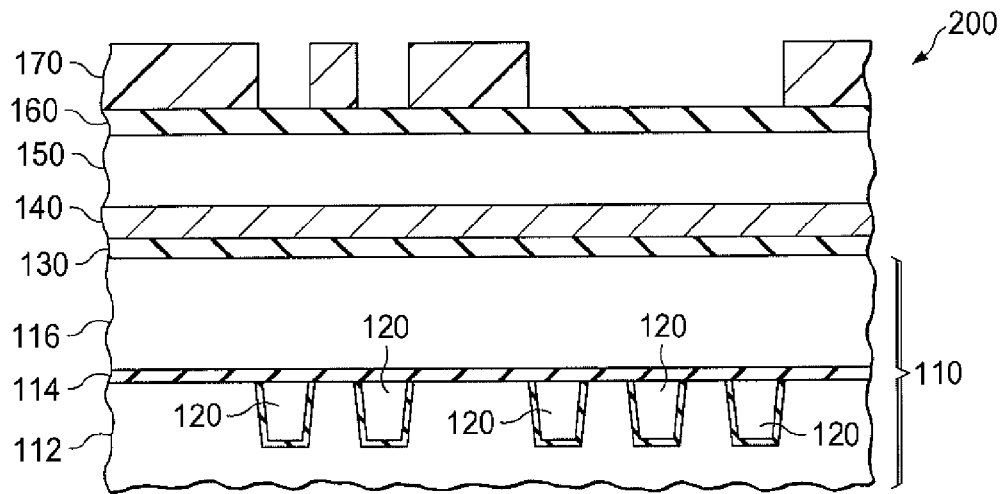
FIGS. 2A-2F illustrate a TFMHM process in accordance with an embodiment of the disclosure.
Figure 2B:
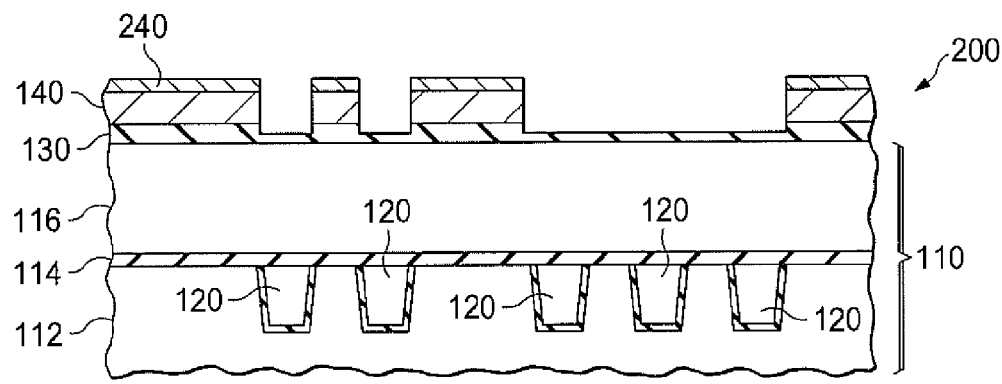

FIGS. 1A through 1F illustrate a trench first metal hard mask (TFMHM) process flow in a dual damascene process for a semiconductor device 200 in accordance with the present disclosure. As will be appreciated, the device 200 in FIG. 2A is shown configured at an initial mask stage for patterning vias and trenches (for eventual fabrication of a second metal line/layer and vias between a first metal line/layer and the second two metal line/layer).

In the embodiment shown, the device 200 includes the dielectric layer 110 having one or more metal lines (or layers) 120 therein. The metal lines or layers 120 are formed of conductive material, such as copper (Cu), and may be other suitable conductive material. As will be appreciated, the dielectric layer 110 may include multiple dielectric layers, including the first dielectric layer 112, the second dielectric layer 114 and the third dielectric layer 116. In one embodiment, the first and third dielectric layers 112, 116 are formed of ultra-low K dielectric materials, while the second dielectric layer 114 may be formed of silicon-carbon-hydrogen-nitrogen, which is typically used for capping inter-level dielectric (ILD) layers, and particularly useful as a copper and air diffusion barrier. As will be appreciated, the second and third layers 114, 116 typically form what is commonly known as an ILD layer.

Above the ILD layer 116 are formed various layers, which have various functions, including sacrificial or mask functions, or both. As shown, the device 200 includes the hard mask layer 130, the metal hard mask layer 140, the planarizing layer 150 and the silicon anti-reflective coating layer 160. In one embodiment, the hard mask layer 130 may be formed with of tetraethyl orthosilicate (TEOS), the metal hard mask layer 140 may be formed of titanium nitride (TiN), and the planarizing layer 150 may be an organic planarizing layer (OPL). Above these layers is disposed or formed the mask layer 170 which is typically formed of resist material.

Figure 2C:
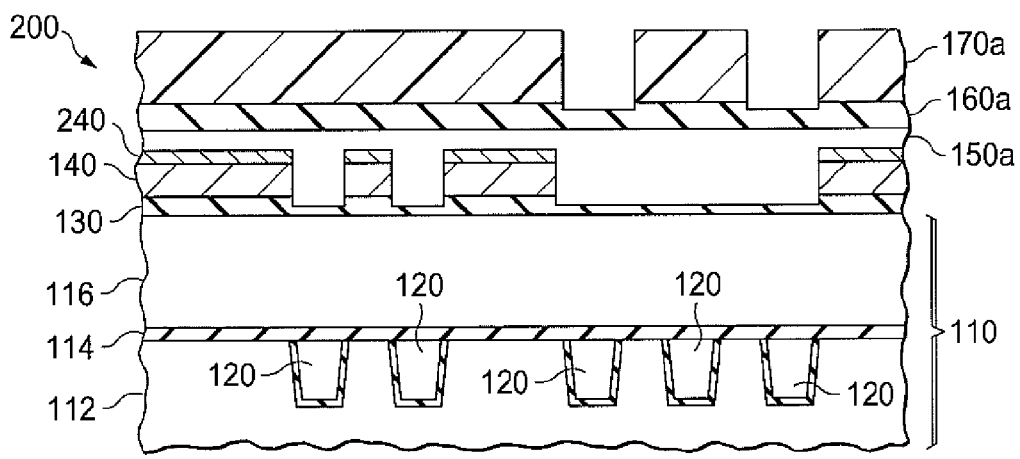
Figure 2D:
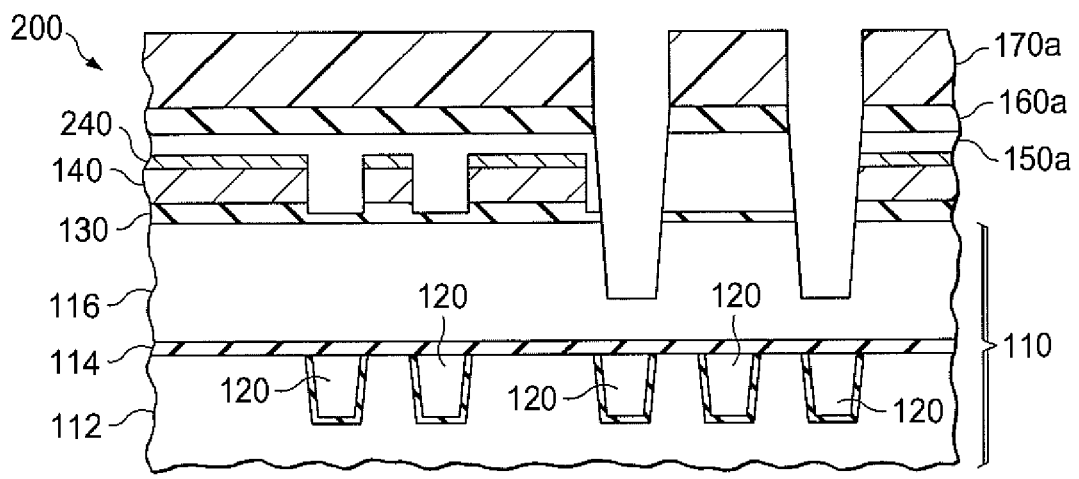
Figure 2E:
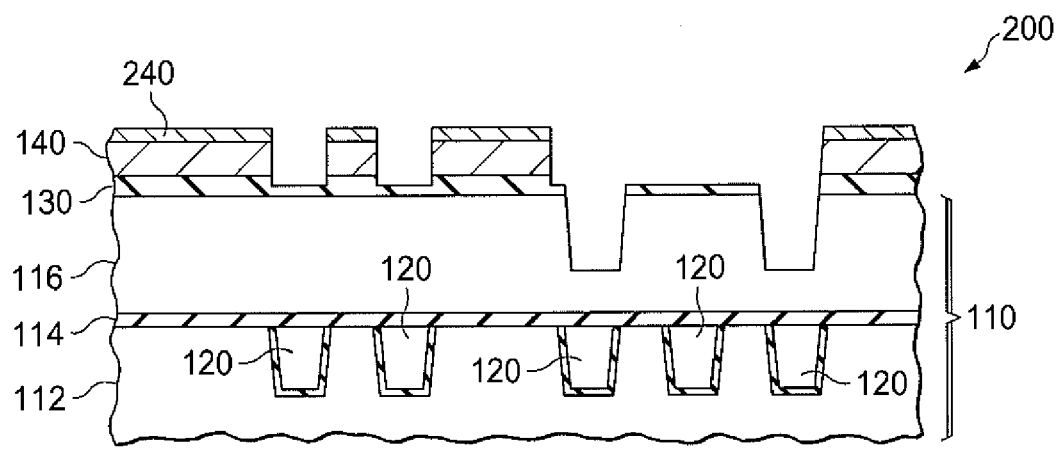

As shown, the mask layer 170 includes openings for patterning trenches (e.g., trenches 180, 182, 184 as described and illustrated further below) that will eventually be formed within the ILD 116 during subsequent processing steps. After patterning, an etching process and a removal process are performed utilizing any suitable processes, including reactive ion etching (REI) for the etching process. The etching process removes the patterned portions of the sacrificial layers 160 and 150, and also removes the metal hard mask layer 140 (and may remove a portion of the mask layer 130 at the patterned locations—as shown). Thereafter, the removal process removes all of the mask layer 170 and the sacrificial layers 160, 150. The resultant structure is illustrated in FIG. 2E.

Figure 2F:
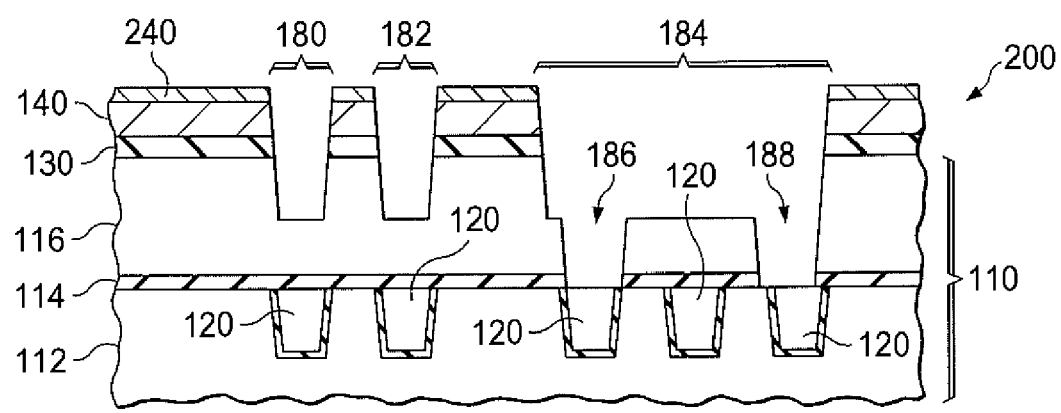

At this point in the process, it will be appreciated that the patterned metal hard mask layer 140 will provide a future mask for the eventual trenches 180, 182, 184 (as described and illustrated further below and in FIG. 2F).

Also, this is the point in which the present disclosure deviates from the prior art TFMHM process (FIGS. 1A-1B). After the removal process, a secondary metal hard mask layer 240 is formed only atop the remaining portions of the metal hard mask layer 140 by a selective deposition process. Optionally, a surface pretreatment may be applied to facilitate the selective deposition process. The secondary metal hard mask layer 240 is formed of a material suitable to withstand (i.e., substantially resistant to) the final etching process (such as RIE) that forms the trench 184 (and the trenches 180, 182) and the vias 186, 188 within the ILD 116. Thus the material forming the secondary metal hard mask layer 240, should be relatively inert during the RIE of the trench and via pattern into the ILD (i.e., it should not form a volatile byproduct during RIE for temperature <200 deg C. with fluorine based RIE gas chemistries). Any material suitable in providing this functionality (or property) may be utilized, including copper (Cu), nickel (Ni), cobalt (Co), gold, (Au), palladium (Pd), cadmium (Cd) silver (Ag), ruthenium (Ru), and all associated alloys. In one embodiment, the material is a metal or metal alloy formed by an electroless deposition process, whereby, the substrate is exposed to a solution that is typically aqueous which contains an ionic form of the intended metal and the appropriate reducing agents. Through a series of chemical reactions involving the activation of the intended surface by the reducing agent and the reduction of the metal ions at this intended surface, uniform metallic layers can be generated with thicknesses ranging from 1-50 nanometers. Alternatively, the secondary metal hard mask layer 240, can also be formed by selective chemical vapor deposition processes that may selectively deposit metals such as cobalt (Co) and ruthenium (Ru).

After formation of the secondary metal hard mask layer 240, the structure undergoes further processing, including formation of the planarizing layer 150a, and the sacrificial layer 160a. Formed above these two layers is the mask layer 170a that includes openings for patterning vias (e.g., vias 186, 188 as described and illustrated further below and in FIG. 2F) that will eventually be formed within the ILD 116 (for contact to two of the metal lines 120) during subsequent processing steps. The resultant structure is illustrated in FIG. 2C. These layers are formed according to any suitable processes.

After patterning, another etching process and a removal process are performed utilizing any suitable processes, including a reactive ion etching (RIE) process. The etching process removes the patterned portions of the sacrificial layers 160a and 150a, as well as the hard mask layer 130, and removes at least a portion of the ILD layer 116 at the patterned locations, as shown. During this RIE process, the secondary metal hard mask layer 240, may be exposed to the RIE plasma but should not be removed. Since the secondary metal hard mask layer 240 is not removed during this RIE process, the portion of the ILD that is removed is defined by the coincidence of the via and trench patterns. The resultant structure is illustrated in FIG. 2D. Thereafter, the removal process removes all of the mask layer 170a, and the sacrificial layers 160a, 150a. The resultant structure is illustrated in FIG. 1E.

At this point, the combination of the patterned metal hard mask layer 140 and secondary metal hard mask 240 provides a mask for the trenches 180, 182, 184. Another etch process is employed (using the mask layers 140, 240 as the mask) to remove the hard mask layer 130 and additional portions of the ILD 116—at the patterned locations. Similarly, the etching process may be any suitable process, including a reactive ion etching (RIE) process. The resultant structure is shown in FIG. 2F.

The above textual description and FIGS. 2A through 2F describe and illustrate the relevant portions of a novel dual damascene TFMHM process. Though not shown, and as will be appreciated, the trenches 180, 182, 184 and the vias 186, 188 are over filled with conductive material, such as a metal (e.g., Cu, Al, etc.) and the resulting structure may be planarized using CMP (to remove any remaining portions of layers 130, 140 and 240). Conventional processing steps may then be performed thereafter, such as formation of additional ILDs and metallization layers.

As will be appreciated, utilization of the secondary metal hard mask layer 240—which is substantially resistant to the etching process for the trench and vias within the ILD 116—enables use of a thinner metal hard mask layer 140 (e.g., TiN). This may advantageously reduce the aspect ratio of the stack. In addition, materials other than TiN may be utilized for the metal hard mask layer 140, provided the material supports electroless deposition of the secondary metal hard mask layer 240.

The selective electroless or selective CVD deposition of metal, as described herein, also solves problems with etch selectivity during via and trench RIE processing used in the TFMHM process. This technique also provides improved via profile.

It will be understood that well known processes have not been described in detail and have been omitted for brevity. Although specific steps, structures and materials may have been described, the present disclosure may not be limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of making a semiconductor component, the method comprising:
    forming an insulating layer over a first metal layer;
    forming a first metal hard mask (MHM) layer over the insulating layer, the first MHM layer comprising a first material;
    forming a trench mask layer over the first MHM layer;
    etching the first MHM layer to form one or more openings through the first MHM layer corresponding to the trench mask layer;
    removing the trench mask layer;
    after removing portions of the first MHM layer, forming a second MHM layer over remaining portions of the first MHM layer, the second MHM layer comprising a second material different from the first material;
    forming a via mask layer above the second MHM layer;
    etching at least a portion of the insulating layer corresponding to the via mask layer to at least partially form a via opening within the insulating layer;
    removing the via mask layer; and
    etching portions of the insulating layer corresponding to the second MHM layer to form the via opening for exposing at least a portion of the metal layer and to form a metal line in the insulating layer.

2. The method in accordance with claim 1 wherein forming the second MHM layer further comprises:
    depositing by an electroless deposition process the second material.

3. The method in accordance with claim 2 wherein depositing by the electroless deposition process further comprises:
    exposing the first MHM layer to an aqueous solution comprising ions of the second material and a reducing agent.

4. The method in accordance with claim 3 wherein the second material comprises at least a one of: nickel (Ni), cobalt (Co), gold, (Au), palladium (Pd), cadmium (Cd) silver (Ag), ruthenium (Ru).

5. The method in accordance with claim 1 wherein the first material of the first MHM layer comprises titanium nitride (TiN).

6. The method in accordance with claim 5 wherein the second material comprises at least a one of: nickel (Ni), cobalt (Co), gold, (Au), palladium (Pd), cadmium (Cd) silver (Ag), ruthenium (Ru).

7. The method in accordance with claim 1 further comprising:
    disposing a first sacrificial layer between the first MHM layer and the trench mask layer; and
    disposing a second sacrificial layer between the second MHM layer and the via mask layer.

8. The method in accordance with claim 7 wherein the first and second sacrificial layers comprise a planarizing layer.

9. The method of claim 1 wherein etching to form the via opening and to form the metal line in the insulating layer further comprises:
    performing a reactive ion etching (REI) process.

10. The method of claim 9 wherein the second material is substantially resistant to the REI process.

11. The method of claim 1 further comprising:
    filling the etched via and metal line with conductive material; and
    planarizing the conductive material.

12. A semiconductor fabrication process comprising:
    forming an insulating layer over a first metal layer;
    forming a first metal hard mask (MHM) layer over the insulating layer, the first MHM layer comprising a first material;
    removing selected portions of the first MHM layer to form one or more openings through the first MHM layer;
    after removing the selected portions of the first MHM layer, forming a second MHM layer over remaining portions of the first MHM layer, the second MHM layer comprising a second material different from the first material;
    forming a via mask layer above the second MHM layer;
    etching at least a portion of the insulating layer corresponding to the via mask layer to at least partially form a via opening within the insulating layer;
    removing the via mask layer; and
    etching portions of the insulating layer corresponding to the second MHM layer to form the via opening for exposing at least a portion of the metal layer and to form a metal line in the insulating layer.

13. The method in accordance with claim 12 wherein forming the second MHM layer further comprises:
    depositing by an electroless deposition process the second material, wherein the electroless deposition process includes exposing the first MHM layer to an aqueous solution comprising ions of the second material and a reducing agent.

14. The method in accordance with claim 13 wherein the second material comprises at least a one of: nickel (Ni), cobalt (Co), gold, (Au), palladium (Pd), cadmium (Cd) silver (Ag), ruthenium (Ru).

15. The method in accordance with claim 12 wherein the first material of the first MHM layer comprises titanium nitride (TiN).

16. The method in accordance with claim 15 wherein the second material comprises at least a one of nickel (Ni), cobalt (Co), gold, (Au), palladium (Pd), cadmium (Cd) silver (Ag), ruthenium (Ru).

17. The method in accordance with claim 12 further comprising:
disposing a sacrificial layer between the second MHM layer and the via mask layer.

18. The method in accordance with claim 17 wherein the sacrificial layer comprises a planarizing layer.

19. The method of claim 12 wherein etching to form the via opening and to form the metal line in the insulating layer further comprises:
performing a reactive ion etching (REI) process.

20. The method of claim 19 wherein the second material is substantially resistant to the REI process.

* * * * *

UNITED STATES PATENT AND TRADEMARK OFFICE
CERTIFICATE OF CORRECTION

PATENT NO. : 8,114,769 B1  
APPLICATION NO. : 12/982956  
DATED : February 14, 2012  
INVENTOR(S) : Ravi Prakash Srivastava and Elbert Huang Page 1 of 1

It is certified that error appears in the above-identified patent and that said Letters Patent is hereby corrected as shown below:

In the Specifications:

Column 3, line 58, delete "115" and insert -- 116 --.

Column 3, line 63, delete "115" and insert -- 116 --.

Column 3, line 65, delete "115" and insert -- 116 --.

Column 5, line 56, delete "2E" and insert -- 2B --.

Signed and Sealed this  
Seventh Day of May, 2013

Teresa Stanek Rea  
*Acting Director of the United States Patent and Trademark Office*